(12) United States Patent
Tsai et al.

(10) Patent No.: US 7,384,831 B2
(45) Date of Patent: Jun. 10, 2008

(54) THIN FILM TRANSISTOR AND MANUFACTURING METHOD THEREOF

(75) Inventors: Wen-Ching Tsai, Hsin-Chu (TW); Yeong-Shyang Lee, Hsin-Chu (TW); Kuo-Yuan Tu, Hsin-Chu (TW); Han-Tu Lin, Hsin-Chu (TW)

(73) Assignee: Au Optronics Corporation, Hsin-Chu (TW)

(*) Notice: Subject to any disclaimer, the term of this patent is extended or adjusted under 35 U.S.C. 154(b) by 0 days.

(21) Appl. No.: 11/812,823

(22) Filed: Jun. 22, 2007

(65) Prior Publication Data

US 2008/0009107 A1     Jan. 10, 2008

Related U.S. Application Data

(62) Division of application No. 11/218,632, filed on Sep. 6, 2005, now Pat. No. 7,247,911.

(30) Foreign Application Priority Data

May 18, 2005  (TW)  ............................... 94116193 A

(51) Int. Cl.
   *H01L 21/84*  (2006.01)
(52) U.S. Cl. ............................... 438/158; 257/E21.561
(58) Field of Classification Search ........ 438/151–166; 257/E21.561
   See application file for complete search history.

(56) References Cited

U.S. PATENT DOCUMENTS

| 6,410,376 B1 * | 6/2002 | Ng et al. | 438/199 |
| 6,686,661 B1 * | 2/2004 | Lee et al. | 257/741 |
| 7,169,653 B2 * | 1/2007 | Lee et al. | 438/149 |

* cited by examiner

Primary Examiner—Richard A. Booth
(74) Attorney, Agent, or Firm—Rosenberg, Klein & Lee

(57) ABSTRACT

A thin film transistor (TFT) and the manufacturing method thereof are disclosed, and the thin film transistor comprises: a substrate, a gate electrode, a first $CuSi_x$ layer, a gate-insulting layer, a semiconductor layer, a second $CuSi_x$ layer, and a source electrode and a drain electrode. The gate electrode is disposed on the substrate, wherein the gate electrode includes the material of copper (Cu). The first $CuSi_x$ layer is disposed between the gate electrode and the substrate. The gate insulating layer is disposed on the gate electrode. The semiconductor layer is disposed on the gate insulating layer. The second $CuSi_x$ layer is disposed between the source electrode and the semiconductor layer and is disposed between the drain electrode and the semiconductor layer, wherein the source electrode and the drain electrode include the material of copper (Cu). The source electrode and the drain electrode are disposed on the second $CuSi_x$ layer. Accordingly, the reliable TFT is provided through providing at last one $CuSi_x$ layer for enhancing the adhesion of copper and silicon and avoiding the diffusion, and the yield is improved as well.

13 Claims, 12 Drawing Sheets

THIN FILM TRANSISTOR AND MANUFACTURING METHOD THEREOF

RELATED APPLICATIONS

This application is a Divisional Patent Application of application Ser. No. 11/218,632, filed on 6 Sep. 2005 now U.S. Pat. No. 7,247,911.

FIELD OF THE INVENTION

The present invention generally relates to a thin film transistor and the manufacturing method thereof, and more particularly relates to a thin film transistor and the manufacturing using at least one $CuSi_x$ layer in order to enhance adhesion characteristic of silicon and copper, and avoid the diffusion.

BACKGROUND OF THE INVENTION

As the semiconductor design and the manufacture technique update, the rate of improvement in components accelerates, and the size of panel and the resolution of TFT-LCD increase, the distortion of the gate pulse signal due to the resistance-capacitance (RC) signal delays will increase. To decrease the RC signal delays, low resistance material for the connection between the components must be chosen. As the density of the components increases, the line width of the connection will decrease to induce the electromigration problems by high current density, so that it becomes a factor in choosing the material. Generally speaking, the conventional connection material is aluminum (Al) which resistivity is about 2.66 $\mu\Omega$-cm. But using copper (1.67 $\mu\Omega$-cm) or silver instead of aluminum for connection material is regarded as a practicable proposal gradually because copper and silver have higher resistance-to-electromigration and lower resistivity than aluminum.

Referring to FIG. 1, a schematic view of a conventional thin film transistor is illustrated. The conventional thin film transistor comprises a substrate 11, a gate electrode 12, a gate insulating layer 13, a semiconductor layer 14, a source electrode 15, and a drain electrode 16. A gate metal is sputtered by physical vapor deposition (PVD) on the substrate 11. After patterning the gate metal by a first photolithography process to form the gate electrode 12, the gate insulating layer 13 and the semiconductor layer 14 are then sequentially deposited on the substrate 11 by Plasma Enhanced Chemical Vapor Deposition (PECVD) and patterned by a second photolithography process, wherein the gate insulating layer 13 can be a $SiN_x$ or $SiO_x$. Then, a second metal layer (source/drain) is sputtered and patterned by a third photolithography process to form the source electrode 15 and the drain electrode 16, wherein the source electrode 15 and the drain electrode 16 are separated by a channel region by etching. Furthermore, the conventional thin film transistor could further comprise a passivation layer and an indium-tin-oxide (ITO) layer which are then patterned by a fourth and a fifth photolithography process, respectively. As manufacturing technique varies, there are four to six steps of photolithography processes in application. This prior art is focused on the structure of the conventional thin film transistor for gist description and is ignored about the other details and principles.

However, in conventional thin film transistor which uses copper to be a gate electrode that at least has following disadvantages. For example, before using PECVD to form the gate insulating layer 13, copper usually suffers oxidation that produces bubbles by reacting with other materials and produces an internal reaction in PECVD and ammonia. The cupric oxide may increase the resistance. In addition, copper expands to silicon easily, for example, the substrate 11 which the principle is silicon, the gate insulating layer 13, and the semiconductor layer 14 having amorphous silicon that become a $CuSi_x$ layer through the reaction that causes instability in the thin film transistor. Moreover, the adhesion in copper and the substrate 11 is bad that causes the peeling of the gate insulating layer 12 after forming gate electrode. The yield of thin film transistor is also decreased due to the characteristic as mentioned above. In order to manufacture thin film transistor, providing better adhesion characteristic and low resistance are a key factor that research and development (R&D) staffs must solve instantly.

SUMMARY OF THE INVENTION

Therefore, the primary object of the present invention is to provide a thin film transistor that comprises a substrate, a gate electrode, , a first copper silicide ($CuSi_x$) layer, a gate insulating layer, a semiconductor layer, a second copper silicide ($CuSi_x$) layer, a source electrode, and a drain electrode. The gate electrode includes the material of copper (Cu) and is disposed on the substrate. The first copper silicide ($CuSi_x$) layer is disposed between the gate electrode and the substrate. The gate insulating layer is disposed on the gate electrode. The semiconductor layer is disposed on the gate insulating layer. The source electrode and the drain electrode are disposed on the semiconductor layer, wherein the source electrode and the drain electrode include the material of copper. The second copper silicide ($CuSi_x$) layer is disposed between the source electrode and the semiconductor layer. The second copper silicide ($CuSi_x$) layer is also disposed between the drain electrode and the semiconductor layer.

Another object of the present invention is to provide a manufacturing method for a thin film transistor. The manufacturing method comprises following steps: providing a substrate, forming a gate electrode on the substrate, wherein the gate electrode includes the material of copper (Cu), forming a first copper silicide ($CuSi_x$) layer between the gate electrode and the substrate, forming a gate insulating layer on the first $CuSi_x$ layer and the gate electrode, forming a semiconductor layer on the gate insulating layer, and forming a source electrode and a drain electrode on the semiconductor layer, wherein the source electrode and the drain electrode include the material of copper. Besides, a second copper silicide ($CuSi_x$) layer can be formed between the source electrode and the semiconductor layer and can be also formed between the drain electrode and the semiconductor layer.

The present invention is to provide another manufacturing method for a thin film transistor. The manufacturing method comprises following steps: providing a substrate, forming a first $CuSi_x$ layer on the substrate, forming a gate electrode on the first $CuSi_x$ layer, wherein the gate electrode includes the material of copper (Cu), forming a gate insulating layer on the gate electrode, forming a semiconductor layer on the gate insulating layer, forming a second $CuSi_x$ layer on the semiconductor layer, and forming a source electrode and a drain electrode on parts of the second $CuSi_x$ layer, wherein the source electrode and the drain electrode include the material of copper. Accordingly, the thin film transistor is provided through using at least one $CuSi_x$ layer in order to improve adhesion characteristic in silicon and copper, and avoid the diffusion. Furthermore, the structure and method could reduce resistance and enhance the adhesion of copper and silicon, and the yield is improved as well.

DETAILED DESCRIPTION OF THE PREFERRED EMBODIMENTS

To make it easier for our examiner to understand the objective of the invention, its innovative features and performance, a detailed description and technical characteristics of the present invention are described together with the drawings as follows.

Figure 1:
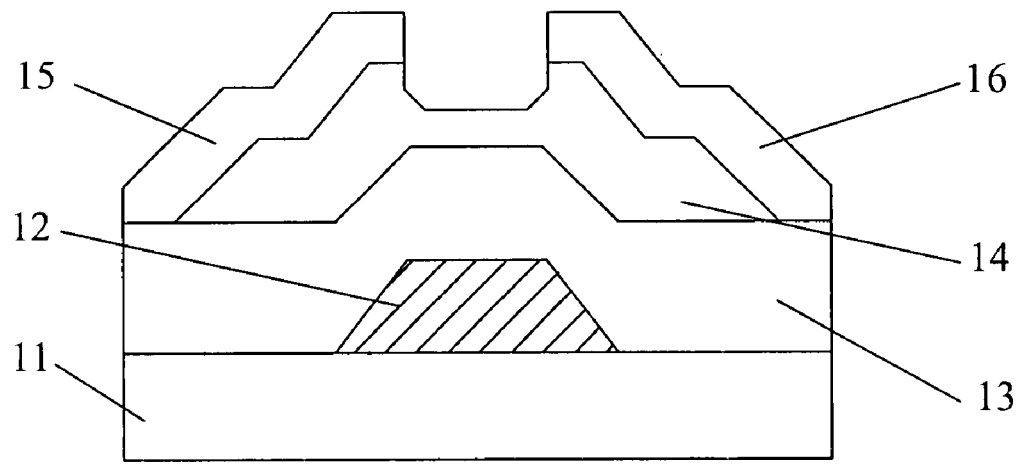
FIG. 1 is a schematic view of a conventional thin film transistor.
Figure 2:
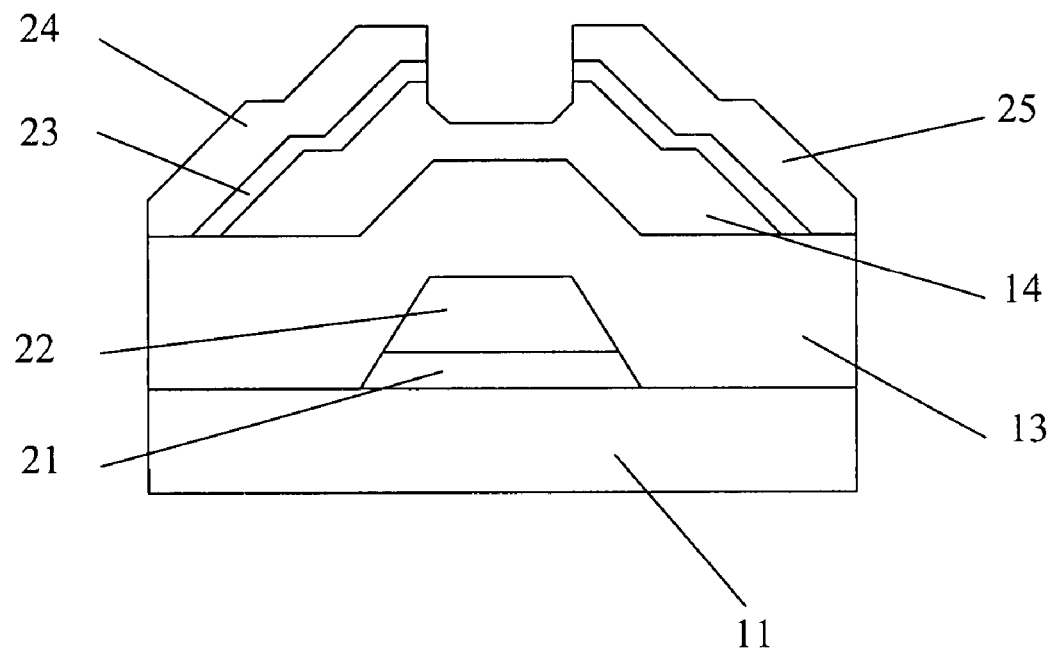
FIG. 2 is a schematic view of a thin film transistor according to an embodiment of the present invention.

Referring to FIG. 2, a sectional drawing of an example of a thin film transistor according to an embodiment of the present invention is illustrated. In the preferred embodiment, the thin film transistor comprises a substrate 11, a first copper silicide ($CuSi_x$) layer 21, a gate electrode 22, a gate insulating layer 13, a semiconductor layer 14, a second copper silicide ($CuSi_x$) layer 23, a source electrode 24, and a drain electrode 25. The gate electrode 22 includes the material of copper (Cu) or copper-alloy and is disposed on the substrate 11. The first copper silicide ($CuSi_x$) layer 21 is disposed between the gate electrode 22 and the substrate 11. The second copper silicide ($CuSi_x$) layer 23 is disposed between the source electrode 24 and the semiconductor layer 14 and is disposed between the drain electrode 25 and the semiconductor layer 14. In addition, the gate insulating layer 13 is disposed on the gate electrode 22. The semiconductor layer 14 is disposed on the gate insulating layer 13. The source electrode 24 and the drain electrode 25 are disposed on the second copper silsicide ($CuSi_x$) layer 23, wherein the source electrode 24 and the drain electrode 25 include the material of copper or copper-alloy.

Figure 3:
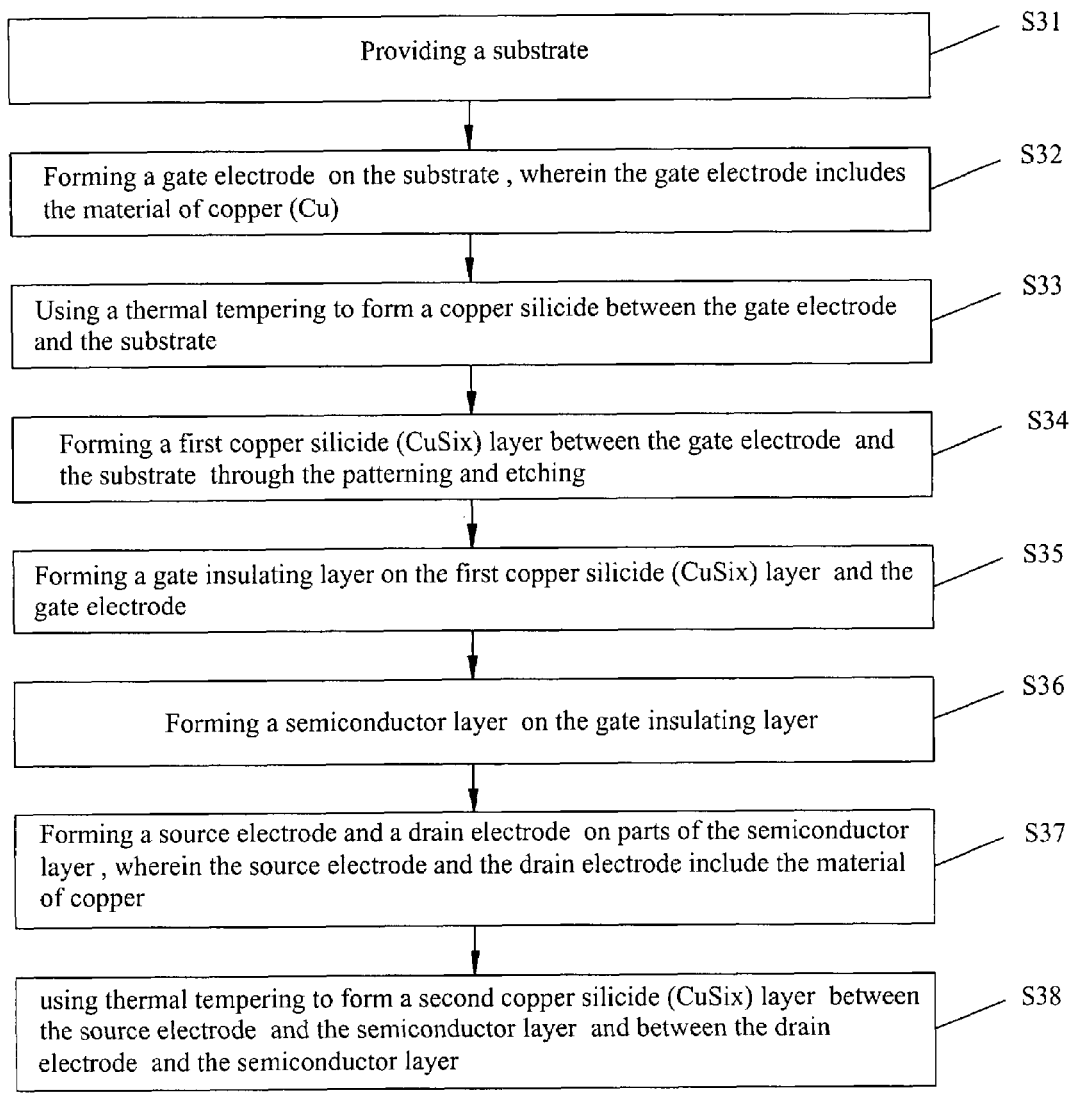
FIG. 3 is a flowchart of a manufacturing method for a thin film transistor according to an embodiment of the present invention.

Referring to FIG. 2 and FIG. 3, wherein FIG. 3 illustrates a manufacturing method for a thin film transistor according to an embodiment of the present invention. In the preferred embodiment, the method comprises the step of: providing a substrate 11 as step S31, forming a gate electrode 22 on the substrate 11 as step S32, wherein the gate electrode includes the material of copper (Cu), using a thermal tempering to form a copper silicide between the gate electrode 22 and the substrate 11 as step S33, forming a first copper silicide ($CuSi_x$) layer 21 between the gate electrode 22 and the substrate 11 through the patterning and etching as step S34, forming a gate insulating layer 13 on the first copper silicide ($CuSi_x$) layer 21 and the gate electrode 22 as step S35, forming a semiconductor layer 14 on the gate insulating layer 13 as step S36, forming a source electrode 24 and a drain electrode 25 on parts of the semiconductor layer 14 as step S37, wherein the source electrode and the drain electrode include the material of copper, and using a thermal tempering to form a second copper silicide ($CuSi_x$) layer 23 between the source electrode 24 and the semiconductor layer 14 and between the drain electrode 25 and the semiconductor layer 14 as step S38.

Figure 4A:
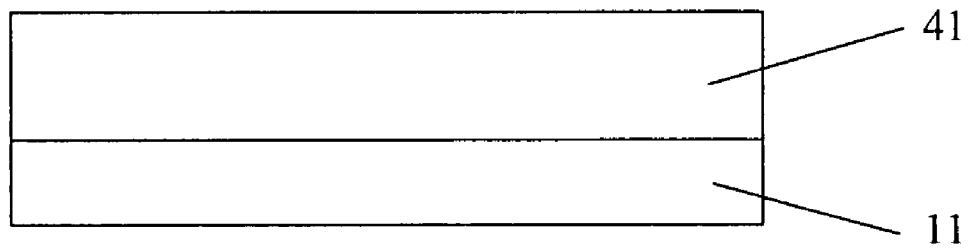
FIG. 4A~4E are block diagrams of a forming process regarding a first $CuSi_x$ layer and a second $CuSi_x$ layer according to an embodiment of the present invention.
Figure 4B:
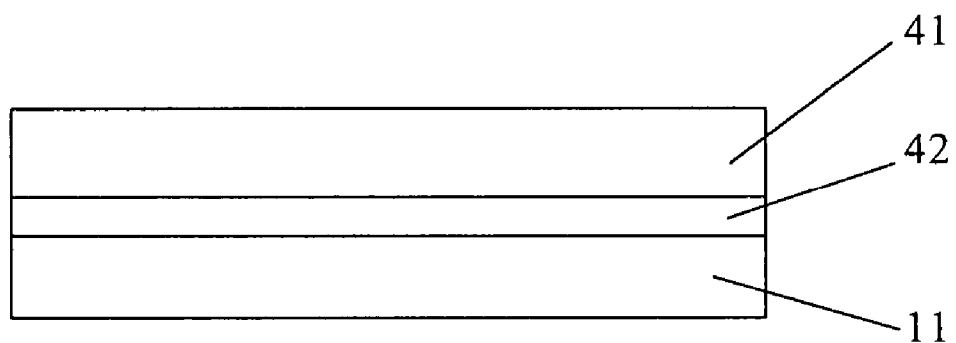
Figure 4C:
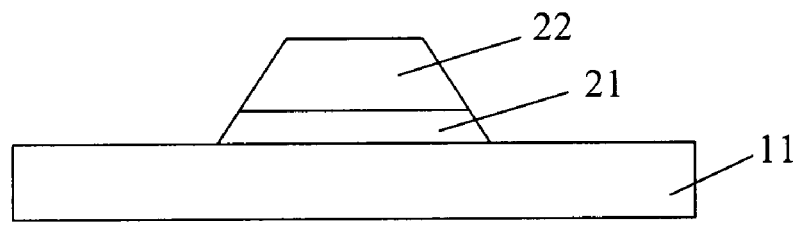
Figure 4D:
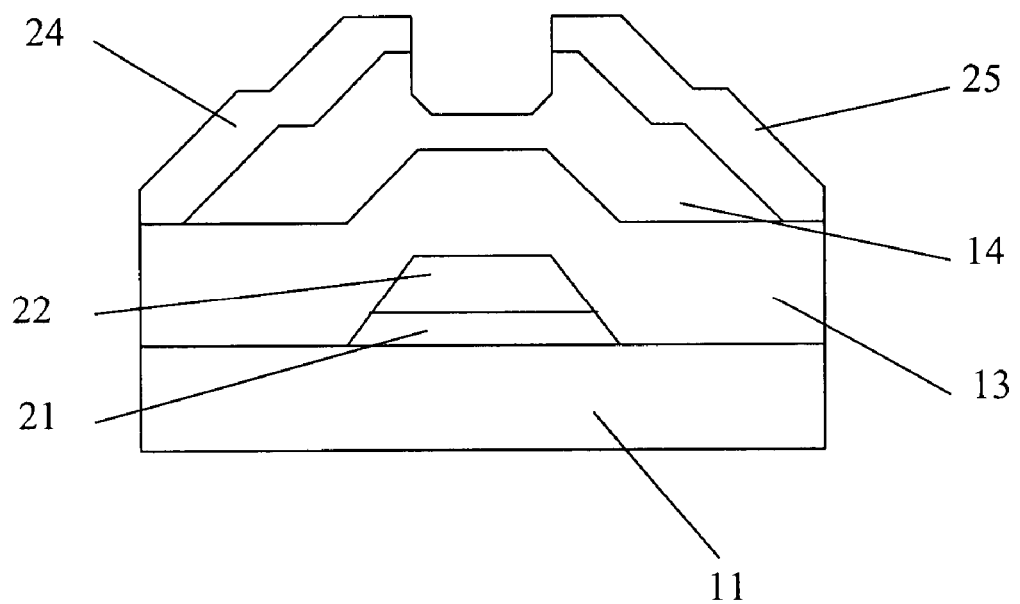
Figure 4E:
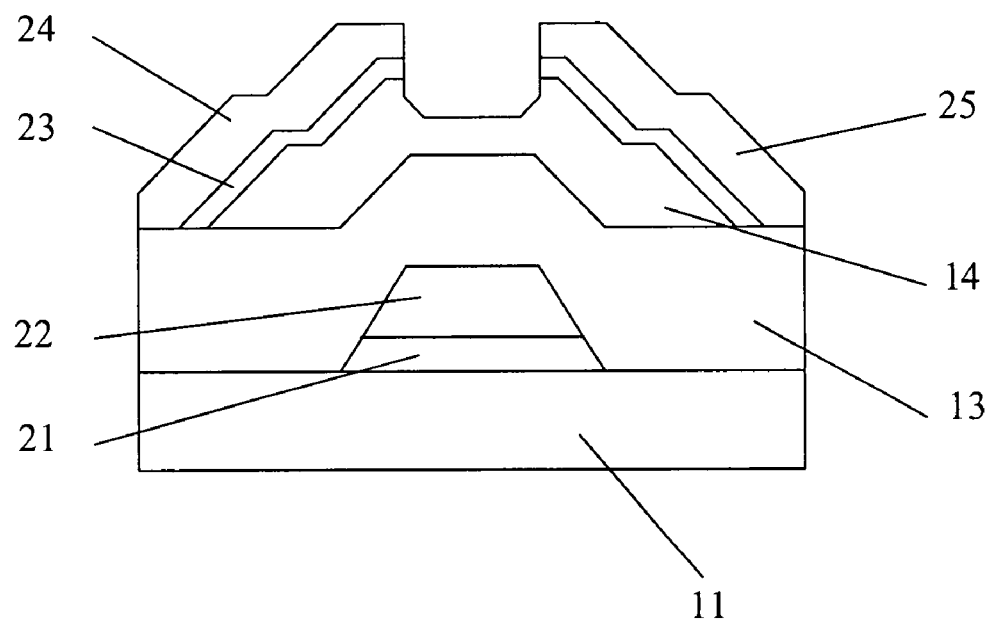

Referring to FIGS. 4A, 4B, 4C, 4D and 4E, a forming process regarding a first $CuSi_x$ layer and second $CuSi_x$ layer according to an embodiment of the present invention is illustrated. In the preferred embodiment, as shown in FIG. 4A, the first $CuSi_x$ layer 21 of thin film transistor comprises steps of: using a physical vapor deposition (PVD) to form a copper 41 to be a gate electrode 22 on the substrate 11 as step S32; as shown in FIG. 4B, using a thermal tempering between 200° C. and 500° C. to form a copper silicide 42 to be a gate electrode 22 between the copper 41 and the substrate 11 as step S33; as shown in FIG. 4C, forming a first $CuSi_x$ layer 21 between the gate electrode 22 and the substrate 11 through the patterning and etching as step S34; as shown in FIG. 4D, a second $CuSi_x$ layer 23 comprises as steps of: forming a source electrode 24 and a drain electrode 25 on parts of semiconductor layer as step S37; and as shown in FIG. 4E, using a thermal tempering between 200° C. and 500° C. to form a second $CuSi_x$ layer 23 between the source electrode 24 and the semiconductor layer 14 and between the drain electrode 25 and the semiconductor layer 14 as step S38.

Figure 5A:
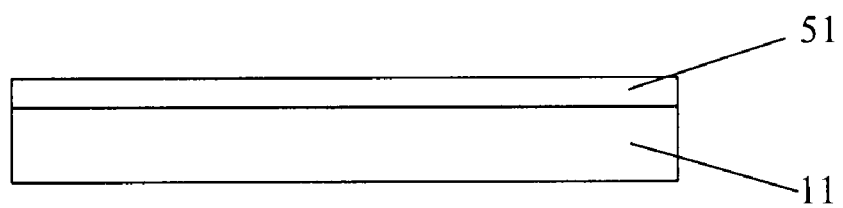
FIG. 5A~5F are another block diagrams of forming process regarding the first $CuSi_x$ layer and the second $CuSi_x$ layer according to an embodiment of the present invention.
Figure 5B:
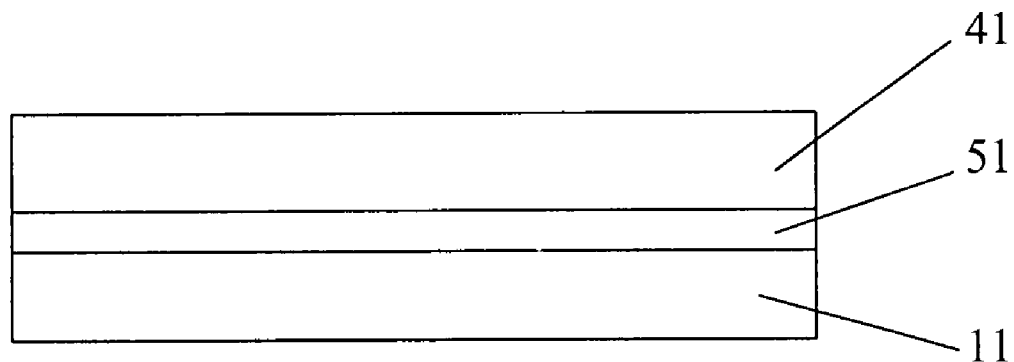
Figure 5C:
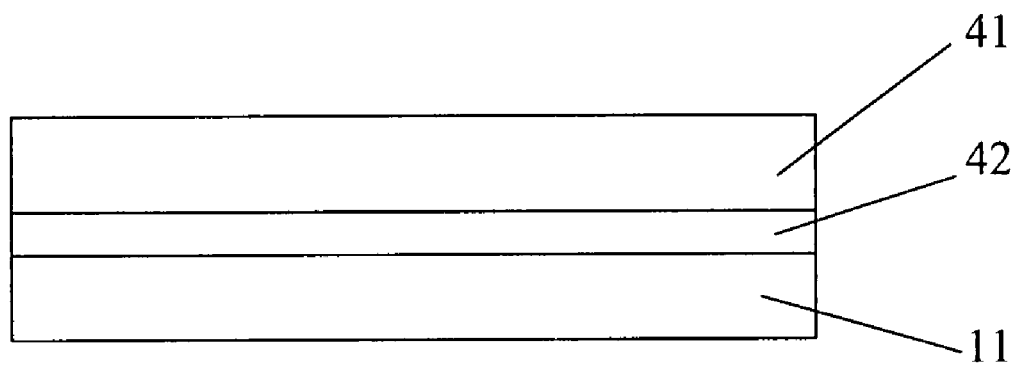
Figure 5D:
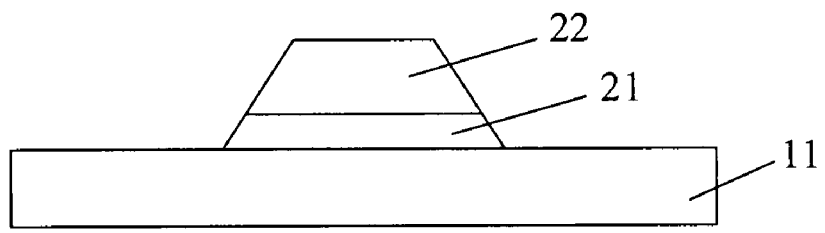
Figure 5E:
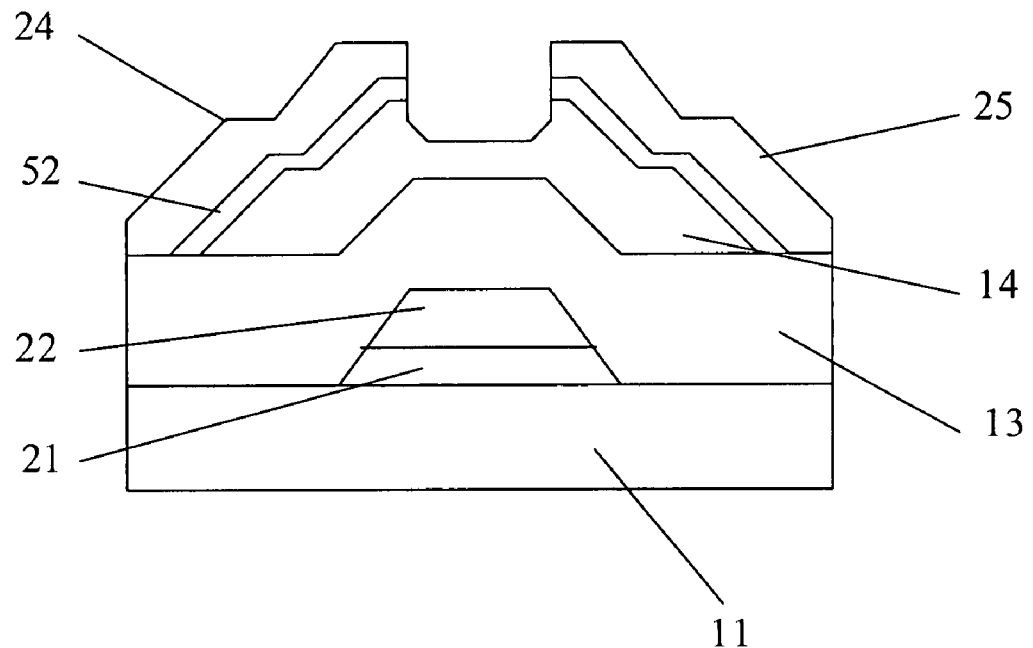
Figure 5F:
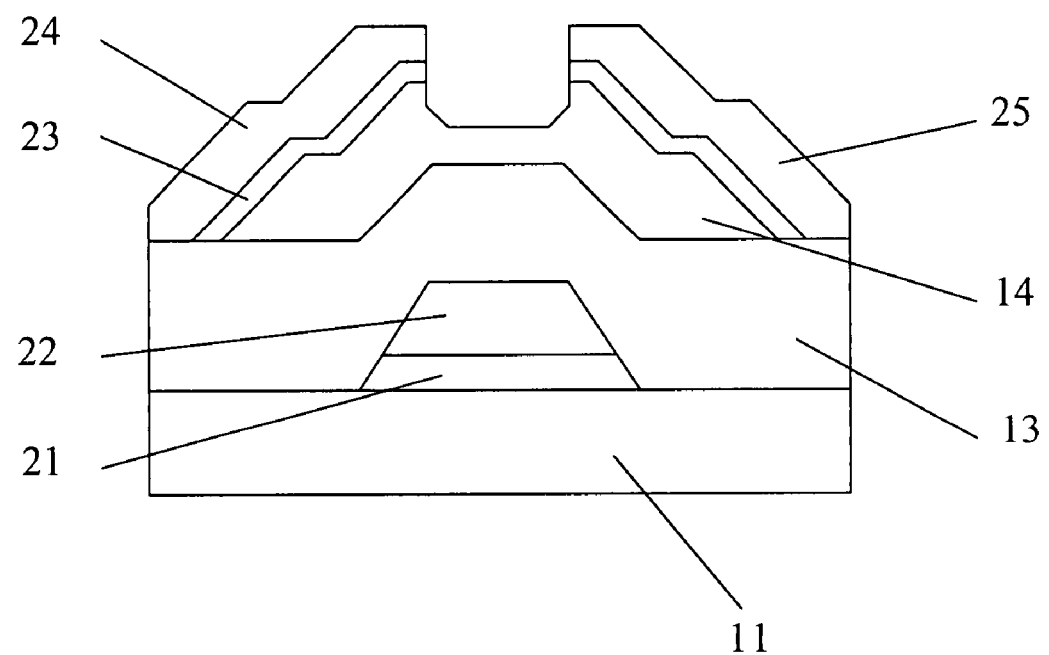

Referring to FIGS. 5A, 5B, 5C, 5D, 5E and 5F, another forming process regarding the first $CuSi_x$ layer and the second $CuSi_x$ layer according to an embodiment of the present invention is illustrated. In the preferred embodiment, as shown in FIG. 5A, the first $CuSi_x$ layer 21 of thin film transistor can be formed a silicon 51 on the substrate 11 by chemical vapor deposition (CVD); as shown in FIG. 5B, using PVD to form a copper 41 to be a gate electrode 22 on the silicon 51 and the substrate 11 as step S32; as shown in FIG. 5C, using a thermal tempering between 200° C. and 500° C. to form a copper silicide 42 to be a gate electrode 22 between the copper 41 and the substrate 11 as step S33; as shown in FIG. 5D, forming a first $CuSi_x$ layer 21 between the gate electrode 22 and the substrate 11 through the patterning and etching as step S34; as shown in FIG. 5E, a second $CuSi_x$ layer 23 can be formed a silicon 52 on the semiconductor layer 14 by using CVD at first; forming a source electrode 24 and a drain electrode 25 on parts of the silicon 52 and the semiconductor layer 14 as step S37; as shown in FIG. 5F, using a thermal tempering between 200° C. and 500° C. to form a second $CuSi_x$ layer 23 between the source electrode 24 and the semiconductor layer 14 and between the drain electrode 25 and the semiconductor layer 14 as step S38.

Figure 6:
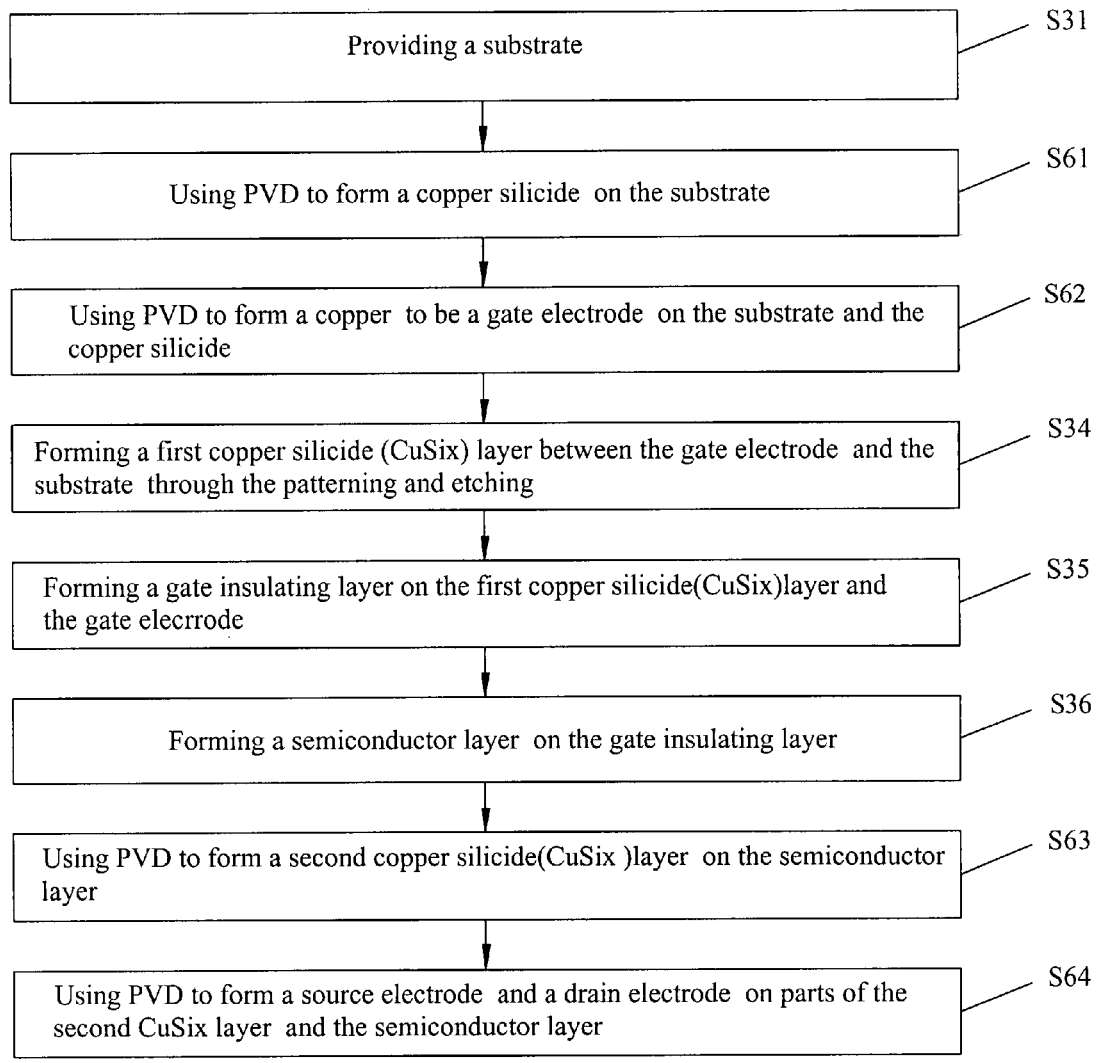
FIG. 6 is another flowchart of a manufacturing process for a thin film transistor according to an embodiment of the present invention.

Referring to FIG. 2 and FIG. 6, illustrate another manufacturing method for a thin film transistor. In the preferred embodiment, the method includes the steps of: providing a substrate 11 as step S31, using PVD to form a copper silicide 42 in FIG. 7 on the substrate 11 as step S61, using PVD to form a copper 41 to be a gate electrode 22 on the substrate 11 and the copper silicide 42 as step S62, forming a first $CuSi_x$ layer 23 between the gate electrode 22 and the substrate 11 through the patterning and etching as step S34, forming a gate insulating layer 13 on the first $CuSi_x$ layer 21 and the gate electrode 22 as step S35, forming a semiconductor layer 14 on the gate insulating layer 13 as step S36, using PVD to form a second $CuSi_x$ layer 23 on the semiconductor layer 14 as step S63, and using PVD to form a source electrode 24 and a drain electrode 25 on parts of the second CuSi$_x$ layer 23 and the semiconductor layer 14.

Figure 7A:
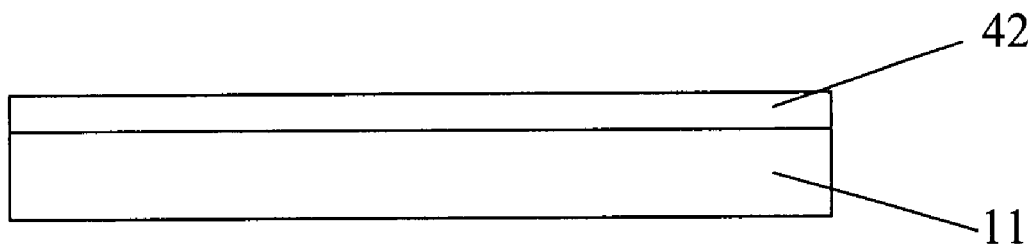
FIG. 7A~7E are another block diagrams of forming process regarding the first $CuSi_x$ layer and the second $CuSi_x$ layer according to an embodiment of the present invention.
Figure 7B:
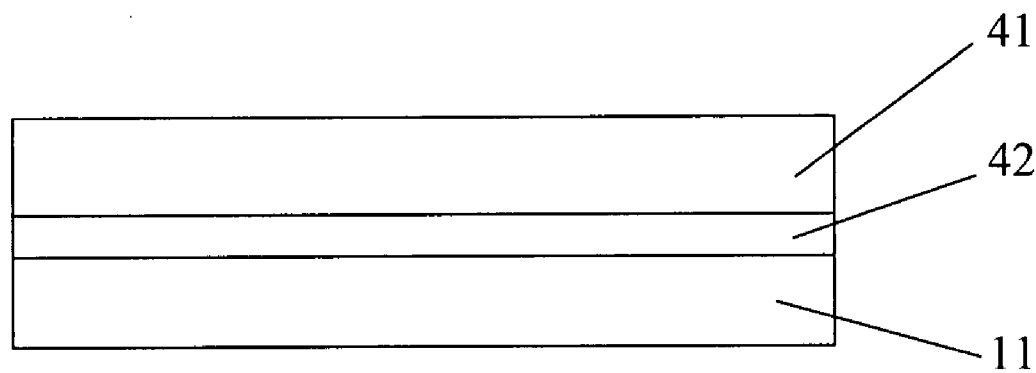
Figure 7C:
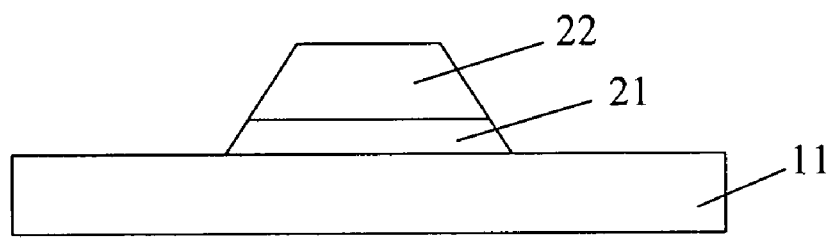
Figure 7D:
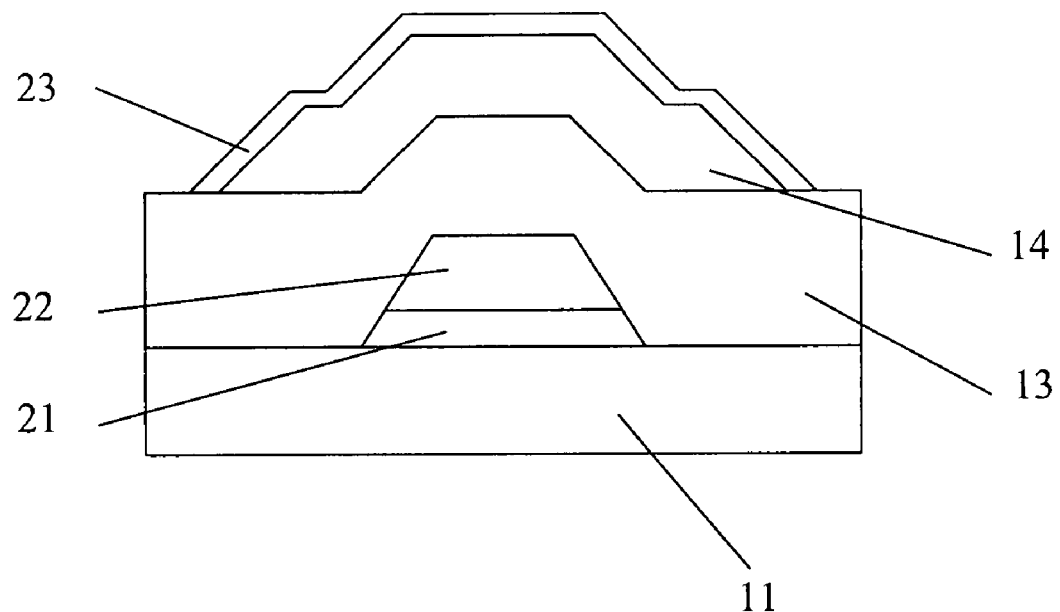
Figure 7E:
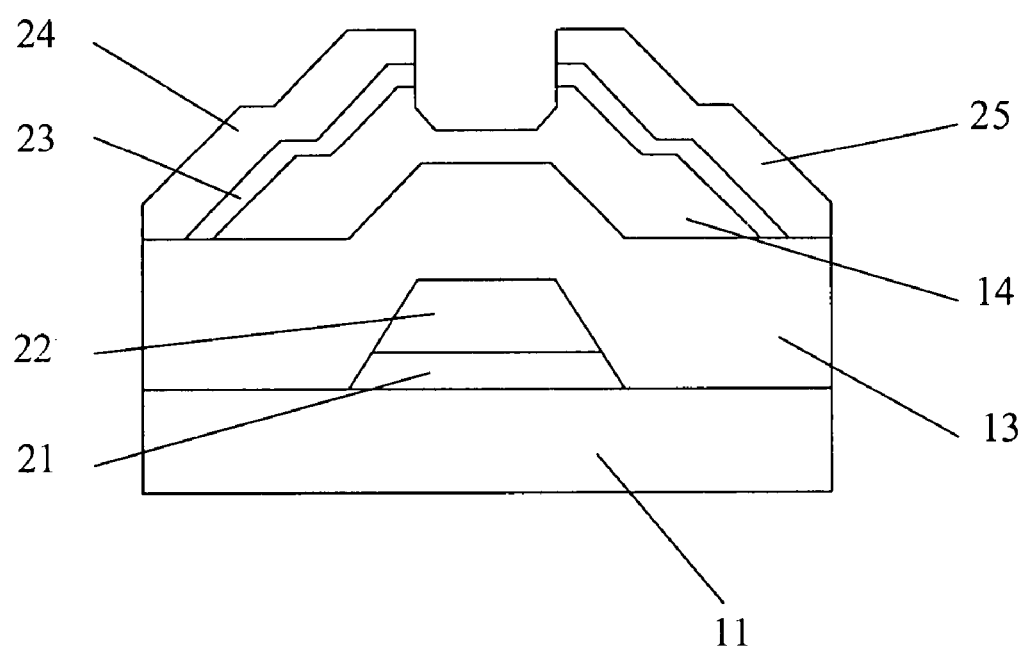

Referring to FIGS. 7A, 7B, 7C, 7D, and 7E, another forming process regarding the first CuSi$_x$ layer and the second CuSi$_x$ layer according to an embodiment of the present invention is illustrated. In the preferred embodiment, as shown in FIG. 7A, the first CuSi$_x$ layer 21 of thin film transistor can use PVD to form a copper silicide 42 to be a gate electrode 22 on the substrate 11 as step S61; as shown in FIG. 7B, using PVD to form a copper 41 to be a gate electrode 22 on the copper silicide 42 and the substrate 11 as step S62; as shown in FIG. 7C, forming a first CuSi$_x$ layer 21 between the gate electrode 22 and the substrate 11 through the patterning and etching as step S34; as shown in FIG. 7D, using PVD to form a second CuSi$_s$ layer 23 on parts of the semiconductor layer 14 as step S63; and as shown in FIG. 7E, using PVD to form a source electrode 24 and a drain electrode 25 on parts of the second CuSi$_x$ layer 23 and the semiconductor layer 14 as step S64.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

In summation of the description above, the present invention is novel and useful and definite enhances the performance over the conventional structure and further complies with the patent application requirements and is submitted to the Patent and Trademark Office for review and granting of the commensurate patent rights.

What is claimed is:

1. A manufacturing method of a thin film transistor, comprising:
   providing a substrate;
   forming a gate electrode on said substrate, wherein the gate electrode includes the material of copper (Cu);
   forming a first copper silicide (CuSi$_x$) layer between said gate electrode and said substrate;
   forming a gate insulating layer on said first CuSi$_x$ layer and said gate electrode;
   forming a semiconductor layer on said gate insulating layer; and
   forming a source electrode and a drain electrode on parts of said semiconductor layer, wherein the source electrode and the drain electrode include the material of copper.

2. The manufacturing method of claim 1, further comprising a step of forming a second copper silicide (CuSi$_x$) layer between said drain electrode and said semiconductor layer.

3. The manufacturing method of claim 1, wherein the step of forming said first CuSi$_x$ layer is achieved by thermal tempering.

4. The manufacturing method of claim 3, wherein the operating temperature of said thermal tempering is between 200° C. and 500° C.

5. The manufacturing method of claim 1, wherein the step of forming said first CuSi$_x$ layer comprises:
   forming a silicon layer by chemical vapor deposition (CVD);
   forming said gate electrode by physical vapor deposition (PVD); and
   forming said first CuSi$_x$ layer by thermal tempering.

6. The manufacturing method of claim 5, wherein the operating temperature of said thermal tempering is between 200° C. and 500° C.

7. The manufacturing method of claim 2, wherein the step of forming said second CuSi$_x$ layer comprises:
   forming said second CuSi$_x$ layer by thermal tempering.

8. The manufacturing method of claim 7, wherein the operating temperature of said thermal tempering is between 200° C. and 500° C.

9. The manufacturing method of claim 2, wherein the step of forming said second CuSi$_x$ layer comprises:
   forming a silicon layer by chemical vapor deposition (CVD);
   forming said source electrode and said drain electrode by physical vapor deposition (PVD); and
   forming said second CuSi$_x$ layer by thermal tempering.

10. The manufacturing method of claim 9, wherein the operating temperature of said thermal tempering is between 200° C. and 500° C.

11. A manufacturing method of a thin film transistor, comprising:
    providing a substrate;
    forming a first CuSi$_x$ layer on said substrate;
    forming a gate electrode on said first CuSi$_x$ layer, wherein the gate electrode includes the material of copper (Cu);
    forming a gate insulating layer on said gate electrode;
    forming a semiconductor layer on said gate insulating layer;
    forming a second CuSi$_x$ layer on said semiconductor layer; and
    forming a source electrode and a drain electrode on parts of said second CuSi$_x$ layer, wherein the source electrode and the drain electrode include the material of copper.

12. The manufacturing method of claim 11, wherein the step of forming said first CuSi$_x$ layer and the step of forming said gate electrode are achieved by physical vapor deposition (PVD).

13. The manufacturing method of claim 11, wherein the step of forming said second CuSi$_x$ layer, the step of forming said source electrode, and the step of forming said drain electrode are achieved by physical vapor deposition.

* * * * *